(12) United States Patent
McCormick

(10) Patent No.: US 6,294,840 B1
(45) Date of Patent: Sep. 25, 2001

(54) DUAL-THICKNESS SOLDER MASK IN INTEGRATED CIRCUIT PACKAGE

(75) Inventor: John P. McCormick, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/443,036

(22) Filed: Nov. 18, 1999

(51) Int. Cl.$^7$ .......................... H01L 23/48; H01L 23/52; H01L 29/40

(52) U.S. Cl. .................. 257/778; 257/737; 174/52.4; 174/260

(58) Field of Search .................. 257/778, 737, 257/779, 738, 706, 671, 672, 673, 678, 777; 174/52.4, 260

(56) References Cited

U.S. PATENT DOCUMENTS 5,869,887 * 2/1999 Urushima .............................. 257/684
5,986,334 * 11/1999 Lee ...................................... 257/667
6,160,705 * 12/2000 Stearns et al. ....................... 361/704

* cited by examiner

Primary Examiner—David Nelms
Assistant Examiner—David Nhu
(74) Attorney, Agent, or Firm—Beyer Weaver & Thomas LLP

(57) ABSTRACT

Provided is a two-step, dual-thickness solder mask material on the substrate surface. The material is preferably applied in a series of screenings: A first screening of the solder mask material in the region where the chip will be placed, and a second screening of solder mask surrounding the place on the substrate surface where the die will be placed, normally over the outside edge regions of the substrate surface. The thickness of this first screening of solder mask may be from about 10 to 20 microns, while the thickness of the second screening of solder mask is about conventional thickness for a solder mask, for example from about 30 to 40 microns.

9 Claims, 4 Drawing Sheets

DUAL-THICKNESS SOLDER MASK IN INTEGRATED CIRCUIT PACKAGE

FIELD OF THE INVENTION

This invention relates generally to semiconductor chip device assembly, and in particular to flip chip package construction. More specifically, the invention relates to improvements in the construction of semiconductor flip chip packages directed to optimizing the standoff height between an IC chip and a packaging substrate.

DESCRIPTION OF THE RELATED ART

In semiconductor device assembly, an integrated circuit (IC) chip or "die" may be bonded directly to a packaging substrate, without the need for a separate leadframe or for separate I/O connectors (e.g. wire or tape). Such chips are formed with ball-shaped beads or bumps of solder affixed to their I/O bonding pads. During packaging, the chip is "flipped" onto its active circuit surface so that the solder balls form electrical connections directly between the chip and conductive traces on a packaging substrate. Semiconductor chips of this type are commonly called "flip chips."

FIGS. 1A, 1B and 1C illustrate stages in a conventional method for packaging a semiconductor flip chip, in which a chip and a packaging substrate are electrically connected and mechanically bonded. FIG. 1A shows a cross-sectional, side view of an unbonded flip chip with the chip 100 having an active circuit surface 102 on which are arranged solder balls 104. The solder may be composed of a low melting point eutectic material or a high lead material, for example. It should be noted that this figure and the figures that follow are intended to be representative and to emphasize features of the present invention, and, for example, do not show the solder balls in proportion to the chip. In current designs, the chip may have dimensions on the order of 0.5×0.5 inch (1 inch=2.54 cm) whereas the unbonded solder balls may have a diameter on the order of 4 to 5 mils (about 100–125 microns) with a pitch 105 of about 250 microns.

Prior to bonding the chip 100 to a packaging substrate, a solder mask 101 is applied to the packaging substrate surface 103. The solder mask performs several functions, including providing electrical insulation resistance between the circuit traces on the substrate, chemical and corrosion resistance or protection, mechanical (scratch, wear) protection, boundaries on solder surfaces, and filling blind and through-hole vias in the substrate. Conventional solder masks are applied as singlestep (single or multiple pass) solder mask layers by screening a wet film onto the packaging substrate surface and then curing the film by oven baking. The wet film can be screened in a pattern or photo-sensitive materials can be used to pattern features into the cured film in order to expose bond pads for making the appropriate electrical connections with the die to be mounted on the package substrate.

Following the application and patterning of the solder mask, solder flux (not shown) is applied to either the active surface 102 of the chip 100 or the packaging substrate surface. The flux serves primarily to aid the flow of the solder, such that the solder balls 104 make good contact with pads on the packaging substrate. It may be applied in any of a variety of methods, including brushing or spraying, or dipping the chip 100 into a thin film, thereby coating the solder balls 104 with flux. The flux generally has an acidic component, which removes oxide barriers from the solder surfaces, and an adhesive quality, which helps to prevent the chip from moving on the packaging substrate surface during the assembly process.

As shown in FIG. 1B, after the flux is applied, the chip 100 is aligned with and placed onto a placement site on the packaging substrate 106 such that the chip's solder balls 104 are aligned with electrical bonding pads 107 or traces on the substrate 106. The substrate is typically composed of a laminate or organic material, such as fiber glass, PTFE (such as Teflon™, available form Gore, Eau Claire, Wisc.) BT resin epoxy-fiberglass laminates or ceramic-plastic composites. Heat (to a temperature of about 220EC, for example) is applied to one or more of the chip 100 and the packaging substrate 106, causing the solder balls 104 to reflow and form electrical connections between the chip 100 and the packaging substrate 106. Then, the remaining flux residue is substantially removed in a cleaning step, for instance by washing with an appropriate solvent.

Currently, the thickness 110 of the single-step solder mask 101 is about 30 to 40 microns (typically about 35 microns) while the pads 107 are about 15 to 20 microns in height. A typical gap 109 between the chip 100 and the top of the solder mask 101 on the packaging substrate 106 is about 70 to 80 microns, with the distance 112 between the chip and the bonding pads being about the diameter of the solder balls, typically about 115 microns.

At this point, the mechanical bonding procedure can begin. An underfill material, typically a thermo-set epoxy 108, such as is available from Hysol Corporation of Industry, California (product numbers 4511 and 4527), Ablestik Laboratories of San Jose, Calif., and Johnson Matthey Electronics of San Diego, Calif., is dispensed into the remaining space (or "gap") 107 between the chip 100 and the substrate 106. In a typical procedure, beads of thermo-set epoxy, are applied long one edge of the chip where the epoxy is drawn under the chip by capillary action until it completely fills the gap between the chip and the packaging substrate. In order to ensure reliable operation of the completed package, it is important that the underfill material 108 be uniformly dispersed in the gap 109. Slight heating of the packaging substrate after dispensing of the underfill epoxy assists the flow. In some cases, the underfill epoxy flow is further assisted by vacuum, or, alternatively, by injection of the epoxy into the gap 109.

After the epoxy 108 has bled through the gap 109, a separate bead of epoxy 111 may also be dispensed and bonded around the perimeter of the chip 100. Thereafter, the epoxy (both the underfill and perimeter bonding epoxy (also referred to as a "fillet"), if any) are cured by heating the substrate and chip to an appropriate curing temperature. In this manner the process produces a mechanically, as well as electrically, bonded semiconductor chip assembly, with the underfill material 108 allowing a redistribution of the stress at the connection between the chip 100 and the substrate 106 from the solder 104 joints only to the entire sub-chip area. FIG. 1C shows the chip 100 interconnected to the packaging substrate 106 electrically by solder 104 joints and mechanically by a cured layer of epoxy 108 in the gap 109 between the chip 100 and the solder mask 101 on the packaging substrate 106.

Underfill materials typically have from about 6 to 8 components including an epoxy base and filler materials which are used to control the shrinkage, CTE and modulus of the cured underfill material. The filler in underfill materials increases the viscosity of the materials and thus detracts from its ability to easily flow ("wick") and uniformly fill the gap 109. This problem is exacerbated with decreasing semiconductor device sizes where ball pitch is decreasing to approximately 225 to 200 microns, raising the prospect of narrower gaps in conventional package designs, for example gaps decreased in size to between about 25 to 50 microns and to even less than 25 microns. These decreased gap sizes increase the difficulty of flip chip underfill processing. In particular, a smaller gap impedes the flow ("wicking") of underfill between the chip and substrate and increases the likelyhood of entrapping voids within the underfill. Voids that bridge two solder balls (or bumps) can result in electrical shorting during subsequent processing of the package. Voids can also provide pathways for metal migration, which could result in electrical leakage or shorting in the package. These defects represent yield, quality or reliability problems that raise the cost of the package.

One possible solution to the wicking problem of filled underfill materials where gaps are more narrow is to remove filler from the epoxy material. However while removing filler improves flow it causes stress issues in the package due to the fact that the under- or unfilled epoxy underfill material is more likely to shrink and have a sub-optimal modulus.

Accordingly, what is needed is a method and apparatus that makes it possible to apply properly constituted underfill material where solder ball pitch is dramatically reduced.

SUMMARY OF THE INVENTION

To achieve the foregoing, the present invention provides a two-step, dual-thickness solder mask material on the substrate surface. The material is preferably applied in a series of screenings: A first screening of the solder mask material in the region where the chip will be placed, and a second screening of solder mask surrounding the place on the substrate surface where the die will be placed, normally over the outside edge regions of the substrate surface. In a preferred embodiment, the thickness of this first screening of solder mask is from about 10 to 20 microns, while the thickness of the second screening of solder mask is about conventional thickness for a solder mask, for example from about 30 to 40 microns. This second region of solder mask overlies regions of the substrate containing metal traces that must be adequately covered by solder mask in order to prevent the possibility of shorting one trace to another. Accordingly, it is not feasible to have thinner solder mask in this outer region.

By forming thinner solder mask in the chip placement region of the substrate, the gap between the chip and the top of the solder mask may be substantially maintained at the level of conventional packages despite smaller solder balls with decreased pitch. Thus properly constituted underfill materials are able to wick into the gap even with the decreased solder ball size and pitch.

In one aspect, the invention provides a semiconductor package. The package includes a packaging substrate having a chip-connecting surface, and an integrated circuit chip electrically and mechanically bound to the substrate on the chip-connecting surface. The package also includes regions of solder mask on said chip-connecting surface. The solder mask regions include regions include a thinner region between the chip and the chip-connecting surface of the substrate, and a thicker region outside the thinner region.

In another aspect, the invention provides a method of fabricating a flip chip package. The method involves providing a packaging substrate having a chip-connecting surface, applying regions of solder mask on the chip-connecting surface. The solder mask regions include regions include a thinner region between the chip and the chip-connecting surface of the substrate, and a thicker region outside the thinner region. The method further involves electrically and mechanically binding a chip to the substrate on the chip-connecting surface.

These and other features and advantages of the present invention are described below with reference to the drawings.

DETAILED DESCRIPTION OF PREFERRED EMBODIMENTS

Reference will now be made in detail to a preferred embodiment of the invention. Examples of preferred embodiments are illustrated in the accompanying drawings. While the invention will be described in conjunction with these preferred embodiments, it will be understood that it is not intended to limit the invention to any particular preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a two-step, dual thickness solder mask material on the substrate surface of a semiconductor package. The material is preferably applied in a series of screenings: A first screening of the solder mask material in the region where the chip will be placed, and a second screening of solder mask surrounding the place on the substrate surface where the die will be placed, normally over the outside edge regions of the substrate surface. In a preferred embodiment, the thickness of this first screening of solder mask is from about 10 to about 20 microns, for example 15 microns, while the thickness of the second screening of solder mask is about conventional thickness for a solder mask, for example from about 30 to 40 microns, for example 35 microns. This second region of solder mask overlies regions of the substrate containing metal traces that must be adequately covered by solder mask in order to prevent the possibility of shorting one trace to another. Accordingly, it is not feasible to have thinner solder mask in this outer region.

By forming thinner solder mask in the chip placement region of the substrate, the gap between the chip and the top of the solder mask may be substantially maintained at the level of conventional packages despite smaller solder balls with decreased pitch. Thus properly constituted underfill materials are able to wick into the gap even with the decreased solder ball size and pitch.

Figure 1A:
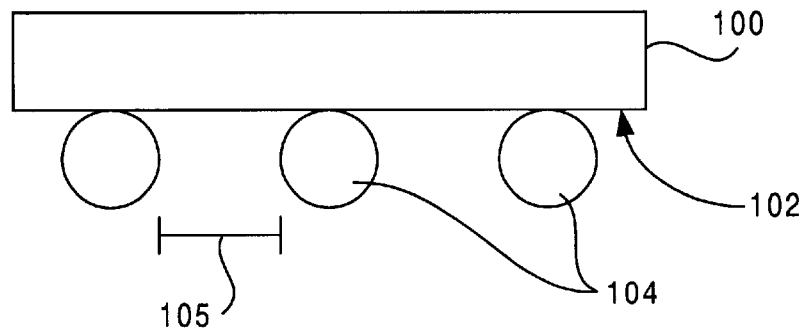
FIG. 1A shows a cross-sectional, side view of an unbonded flip chip.
Figure 1B:
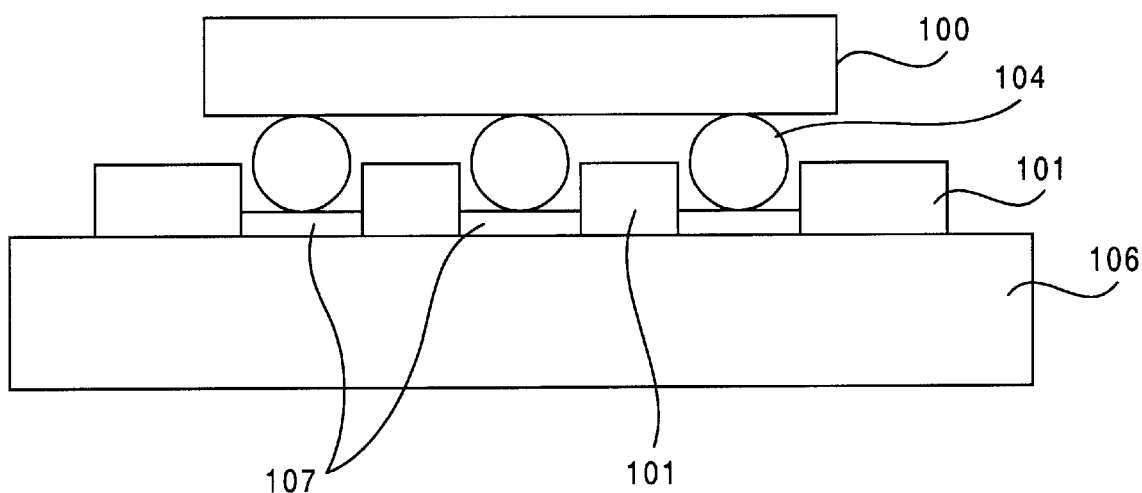
FIG. 1B shows a cross-sectional, side view of a flip chip aligned with and placed onto a placement site on a packaging substrate.
Figure 1C:
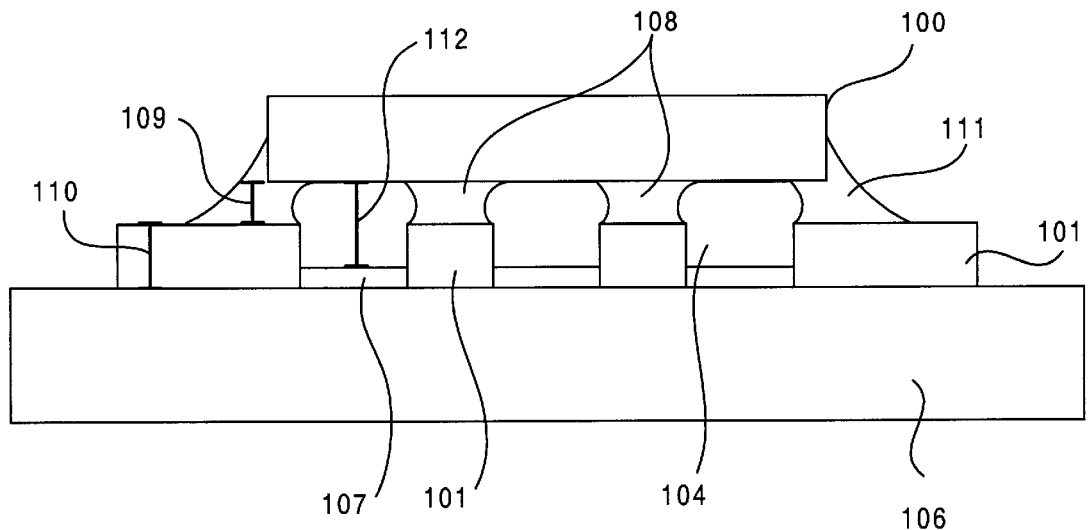
FIG. 1C shows a cross-sectional, side view of a flip chip interconnected to a packaging substrate electrically by solder joints and mechanically by a cured layer of epoxy in the gap between the chip and the solder mask on the packaging substrate.
Figure 2:
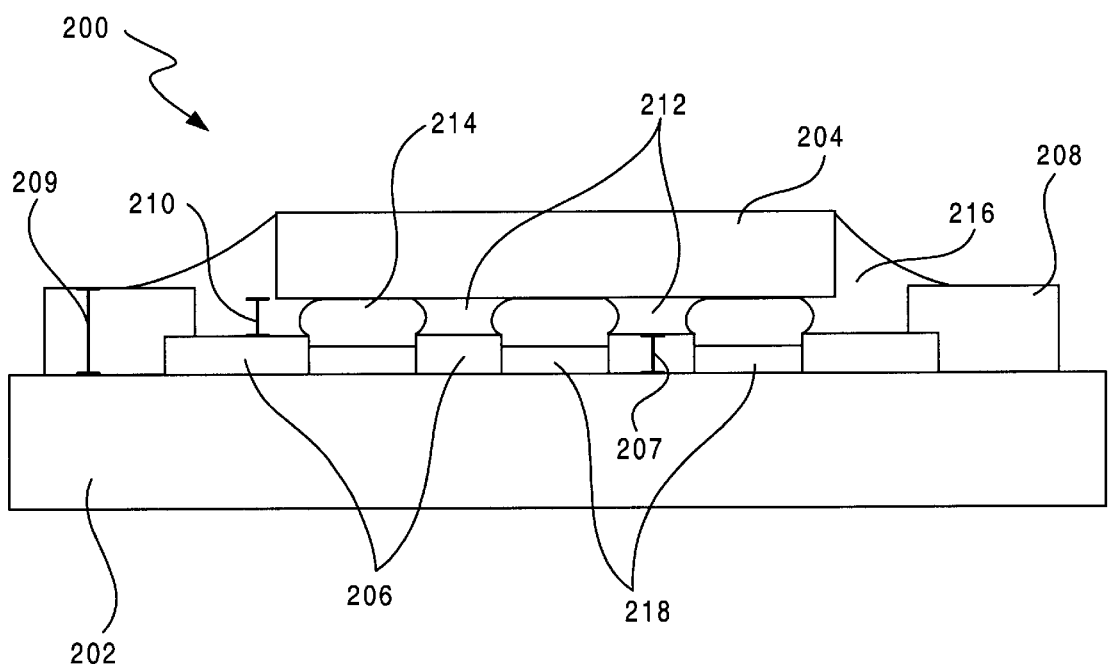
FIG. 2 depicts a cross-sectional view of a dual-thickness solder mask semiconductor flip chip package in accordance with a preferred embodiment of the present invention.

FIG. 2 depicts a cross-sectional view of a semiconductor package in accordance with a preferred embodiment of the present invention. The package 200 includes a packaging substrate 202 electrically and mechanically bonded to a chip 204. Rather than the conventional single-step uniform thickness solder mask of conventional packages however, the package includes a solder mask having two different regions of different thicknesses. In the region where the chip 204 is bonded to the substrate 202 a solder mask region 206 has a thickness 207 less than that of the thickness 209 of a second region 208 outside of the chip area.

The relative thicknesses of the two regions of solder mask is such that the gap 210 between the chip 204 and the substrate 202 is maintained at about a conventional distance which provides sufficient space for a suitably filled underfill material 212 to be flowed into the gap 210 with minimal risk of void formation or other processing complications arising from narrow gaps. Thus, the package may incorporate smaller solder balls 214 with decreased pitch, for example, about 100 micron diameter solder balls with a pitch of about 225 microns, and about 85–90 micron diameter solder balls with a pitch of about 200 microns, while maintaining sufficient gap thickness for effective underfill dispensation. Of course, it should be understood that more than two thicknesses of solder mask may also be used in accordance with the present invention.

To complete the package, a fillet 216 formed around the perimeter of the chip 204 and the package is heated to reflow the solder balls 214 so that they electrically bond the chip to the packaging substrate through the bonding pads 218.

In a preferred embodiment, the solder mask is preferably a photo-definable material, such as are well known to those of skill in the art, to facilitate the patterning of small accurate features, such as the solder bonding pads 218. Generally speaking, the solder mask may be any suitable insulating material and may be patterned with screens during wet film deposition and cured by oven baking after deposition, by laser ablation following curing of an unpatterned mask, or by other methods such as are well known to those of skill in the art. For example, a dry film solder mask may be used with the film being hot-laminated to the substrate and then patterned to produce the solder boundaries.

The chip-region solder mask 206 is preferably deposited with a thickness much less than that of conventional solder masks, for example, about 10 to 20 microns. The outside-chip-region solder mask region 208 may be deposited by any conventional method and have a conventional thickness of about 30–40 microns, typically about 35 microns.

In a preferred embodiment, the chip-region solder mask 206 should be approximately the same size as the chip, preferably slightly larger, for example, by about 0.5 to 1.0 mm (and up to about 3.0 mm perhaps on at least one side in order to provide access for a nozzle dispensing underfill). There may be a space or spaces between the chip-region solder mask 206 and the outside-chip-region solder mask 208, and the geometrical design or shape of the solder mask regions may vary considerably. In a particularly preferred embodiment, the chip region of the solder mask 206 is slightly larger, for example, about 1 mm per side, than the area of the chip 204. In this way, sufficient space is available to provide access to the gap for dispensation of the underfill material.

As noted above, a thinner than conventional solder mask risks the existence of partially- or unfilled via holes in the packing substrate. However, the present invention is able to avoid this problem since in the chip region the solder mask is supplemented by the underfill material which assists in filling any holes unfilled by the thinner solder mask. Outside of the chip region, the conventionally-thick solder mask capably fills any such holes. Both solder mask regions are therefore able to achieve the goals of conventional solder masks, noted above.

Thus, the dual thickness solder mask of the present invention allows for adjustment and maximization of the standoff height between the chip and the substrate in flip chip packages to facilitate the underfill process, particularly where solder ball (bump) sizes and pitches decrease with decrease device size. Maximizing (or otherwise optimizing) standoff height reduces the chances of voids in the underfill. The thinner solder mask layer in the chip region may also facilitate the patterning of small-sized features, particularly solder bond pads, by minimizing the side-wall slope in the mask aperatures during pattern etching.

Figure 3:
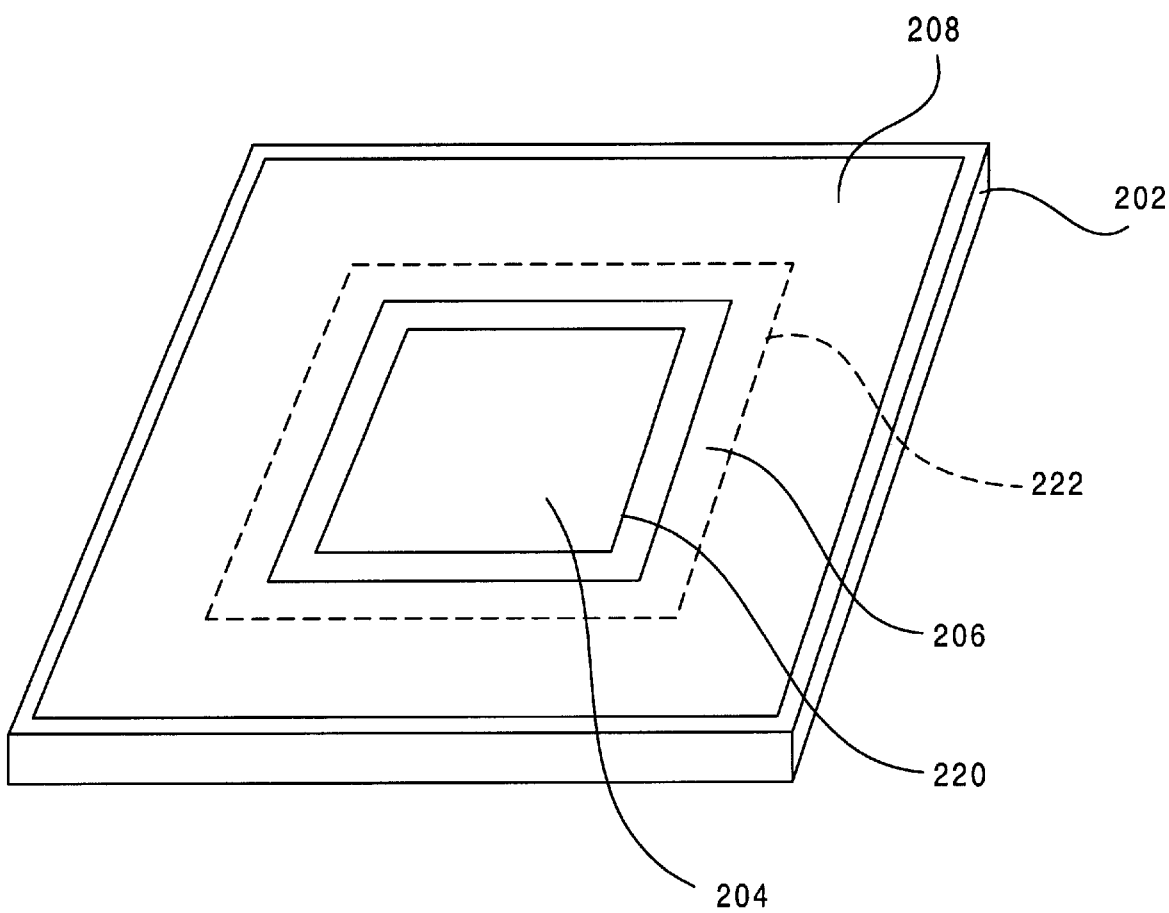
FIGS. 3 depicts a top plan perspective view of the flip chip package of claim 2.

FIG. 3 depicts a top perspective plan view of the package of FIG. 2 in order to illustrate the arrangement of various features form another perspective. The packaging substrate 202 is shown in perspective with the features on its surface shown in plan. The outside-chip solder mask region 208 surrounds the chip 204. The chip region solder mask 206 is in the region below the chip 204 and extends slightly beyond the chip perimeter 220 to underlie the outside-chip solder mask region 208, as represented by phantom line 222. It is also possible to have an unmasked region around the perimeter of the chip 204 since this area will ultimately be covered by the underfill/fillet.

Figure 4:
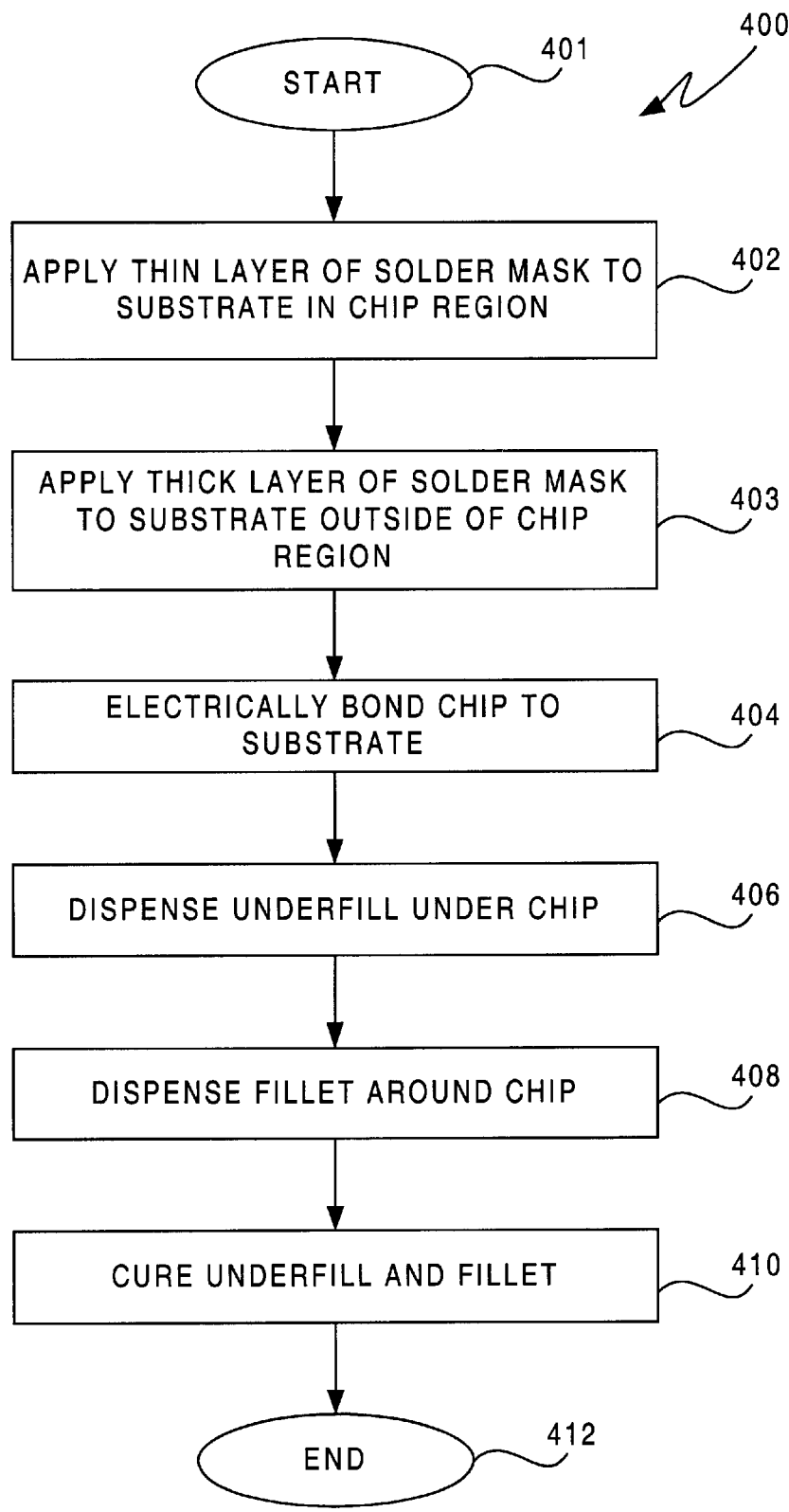
FIG. 4 depicts a process flow diagram of a method of fabricating a two-step. dual thickness solder mask flip chip package in accordance with a preferred embodiment of the present invention.

Many conventional process techniques, and adapted techniques as described herein, may be used to achieve a variety of solder mask patterns and thicknesses in accordance with the present invention. FIG. 4 provides a process flow for a method of fabricating a semiconductor package in accordance with the present invention. Processes in accordance with the present invention may include up to several additional steps not described or illustrated here in order not to obscure the present invention.

The process 400 starts at 401, and at a step 402 a relatively thin layer of solder mask is applied to a packaging substrate in the region where a chip is to be bonded to the substrate. As noted above, the thickness of this thinner solder mask layer may be about 10 to 20 microns and it may be applied and patterned in any suitable way using any suitable material, such as are described above. At a step 403, a relatively thick layer of solder mask is applied to the packaging substrate in a region outside where the chip is to be bonded to the substrate. As noted above, the thickness of this thicker solder mask layer may be about 30–40 microns, preferably about 35 microns, and it too may be applied in any suitable way using any suitable material, such as are described above. In a preferred embodiment, the chip region is processed with solder mask prior to the outside-chip region in order to facilitate thickness control, dimensional accuracy, and ease of processing. However, it is possible to deposit the solder mask regions in any order.

At a step 404, the chip is electrically bound to the substrate by applying flux and reflowing the solder balls (bumps). Underfill is dispensed under the chip at a step 406 using any suitable technique, such as dispensation from a needle at the side of the chip. A fillet is also dispensed around the chip at a step 408, and the underfill and fillet are cured at a step 410. Alternatively, steps 404 to 410 may involve a mixture of underfill and flux being dispensed into the gap and a fillet being applied around the perimeter following application of the solder mask regions, and the package may be heated in order to reflow the solder and cure the underfill. In this way the electrical and mechanical bonding are accomplished in a single heating step. The process ends at 412.

Thus, the present invention provides a two-step, dual-thickness solder mask design and processing method which allows for optimization (typically maximization) of the standoff height between the chip and the substrate in a flip chip package.

Although the foregoing invention has been described in some detail for purposes of clarity of understanding, it will be apparent that certain changes and modifications may be practiced within the scope of the appended claims. It should be noted that there are many alternative ways of implementing both the process and apparatuses of the present invention. Accordingly, the present embodiments are to be considered as illustrative and not restrictive, and the invention is not to be limited to the details given herein, but may be modified within the scope and equivalents of the appended claims.

What is claimed is:

1. A semiconductor package, comprising:
    a packaging substrate having a chip-connecting surface;
    an integrated circuit chip electrically and mechanically bound to said substrate in a chip bonding area on said chip-connecting surface;
    a plurality of regions of solder mask on said chip-connecting surface, said plurality of regions comprising,
        a first region between said chip and said chip-connecting surface in the chip bonding area of said substrate and having a first thickness, and
        a second region outside said chip bonding area of said chip, and having a second thickness greater than said first thickness.

2. The semiconductor package of claim 1, wherein said first region has a thickness of about 10–20 microns.

3. The semiconductor package of claim 2, wherein said second region has a thickness of about 30–40 microns.

4. The semiconductor package of claim 3, wherein said first region has a thickness of about 15 microns, and said second region has a thickness of about 35 microns.

5. The semiconductor package of claim 1, wherein said chip is electrically bonded to said substrate by solder balls having a diameter of no more than about 100 microns.

6. The semiconductor package of claim 1, wherein said chip is electrically bonded to said substrate by solder balls having a diameter of about 100 microns and a pitch of about 225 microns.

7. The semiconductor package of claim 1, wherein said chip is electrically bonded to said substrate by solder balls having a diameter of about 85–90 microns and a pitch of about 200 microns.

8. The semiconductor package of claim 1, wherein said first region extends beyond a region covered by said chip.

9. The semiconductor package of claim 8, wherein said first region extends beyond the region covered by said chip by about 0.5 to 1.0 mm.

* * * * *